(12) United States Patent
Kofune

(10) Patent No.: US 6,222,831 B1
(45) Date of Patent: Apr. 24, 2001

(54) RECEIVING CIRCUIT OF CELLULAR TELEPHONE SET

(75) Inventor: Kazushi Kofune, Soma (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/042,317

(22) Filed: Mar. 13, 1998

(30) Foreign Application Priority Data

Mar. 25, 1997 (JP) .................................................... 9-071786

(51) Int. Cl.[7] .................................................. H04B 7/216
(52) U.S. Cl. .................... 370/335; 370/342; 370/252; 370/343; 455/522
(58) Field of Search .................................... 370/280, 337, 370/348, 489, 294, 252, 479, 335, 342, 330, 206, 209, 315, 319, 320, 321, 329, 336, 339, 343, 344, 345; 455/411, 462, 550, 522, 572

(56) References Cited

U.S. PATENT DOCUMENTS

| | | | |
|---|---|---|---|
| 4,995,072 | * 2/1991 | Pedogo | 379/61 |
| 5,267,262 | * 11/1993 | Wheatley | 455/522 |
| 5,799,010 | * 8/1999 | Lomp et al. | 370/335 |
| 6,049,535 | * 4/2000 | Ozunktrunk et al. | 370/335 |
| 6,157,619 | * 12/2000 | Ozunktrunk et al. | 370/252 |

FOREIGN PATENT DOCUMENTS 08316873   11/1996   (JP) .

* cited by examiner

Primary Examiner—Dang Ton
Assistant Examiner—Anthony Ton
(74) Attorney, Agent, or Firm—Brinks Hofer Gilson & Lione

(57) ABSTRACT

A receiving circuit of a cellular telephone set comprises an intermediate frequency amplifier including an amplifying transistor shared for use in both code division multiple access mode and frequency division multiple access mode. A collector bias current of the transistor is switched to a large current in the code division multiple access mode and to a small current in the frequency division multiple access mode.

2 Claims, 1 Drawing Sheet

RECEIVING CIRCUIT OF CELLULAR TELEPHONE SET

BACKGROUND OF THE INVENTION

1. Field of the Invention

The present invention relates to a receiving circuit of a cellular telephone set operating on both the code division multiple access method and the frequency division multiple access method. More particularly, the invention relates to an intermediate frequency circuit in the receiving circuit.

2. Description of the Related Art

Described below with reference to FIG. 2 is part of a conventional receiving circuit used by what is known as a dual mode cellular telephone set operating on both the code division multiple access method and the frequency division multiple access method.

In a cellular telephone set 31 shown in FIG. 2, a signal from a transmitting circuit 32 is fed through an antenna sharing device 33 to an antenna 34 from which the signal is transmitted to a base station, not shown. A signal sent from the base station is received by the antenna 34 and input to a receiving circuit 35 via the antenna sharing device 33. This type of cellular telephone set 31 is capable of sending and receiving signals to and from the base station in either a code division multiple access mode (called the CDMA mode hereunder) or a frequency division multiple access mode (called the FM mode hereunder).

In the receiving circuit 35, a received signal on a bandwidth of about 880 MHz passes through the antenna sharing device 33 to reach a low-noise amplifier 36 for amplification. The amplified signal is input to a mixing circuit 37 whereby the signal is mixed with an oscillation signal from a local oscillator 38. The mixing circuit 37 outputs a signal with an intermediate frequency of about 85 MHz to an intermediate frequency amplifier 39. The amplifier 39 converts the frequency of the received signal to a bandwidth per channel of about 1.23 MHz for the CDMA mode or about 30 kHz for the FM mode. The received signal of either the CDMA or FM mode alone is converted in terms of frequency.

The intermediate frequency amplifier 39 uses a transistor 42 whose base is supplied with a fixed bias voltage from bias resistors 40 and 41. An intermediate frequency signal, after being amplified to the appropriate level by the intermediate frequency amplifier 39, is output from the collector of the transistor 42.

Following amplification by the intermediate frequency amplifier 39, the intermediate frequency signal of the CDMA mode is sent through a switching diode 43 to a filter 45 dedicated to filtering CDMA mode intermediate frequency signals; the intermediate frequency signal of the FM mode is forwarded through a switching diode 44 to a filter 46 that filters FM mode intermediate frequency signals.

Where the cellular telephone set 31 is used in the CDMA mode, a mode switching voltage applied to a mode switching terminal X1 causes a current to flow through a resistor 47, the switching diode 43 and a resistor 48. This causes the switching diode 43 to conduct, allowing the CDMA mode intermediate frequency signal to reach the filter 45. Where the cellular telephone set 31 is operated in the FM mode, a mode switching voltage applied to a mode switching terminal X2 causes a current to flow through a resistor 49, the switching diode 44 and the resistor 48. This causes the switching diode 44 to conduct, carrying the FM mode intermediate frequency signal to the filter 46.

Different levels of electrical performance are required in each of the CDMA mode and the FM mode. The operation in the CDMA mode, in particular, requires that any intermodulation distortion caused by the intermediate frequency amplifier 39 be minimized. That requirement is met typically by establishing values of the bias resistors 40 and 41 such that a large operating current (i.e., collector bias current) flows continuously through the transistor 42 of the intermediate frequency amplifier 39. That is, the intermediate frequency amplifier 39 is made to operate from the same operating current regardless of the CDMA mode or FM mode being in effect.

In the conventional receiving circuit of the conventional cellular telephone set, as described, a large operating current flows through the transistor 42 of the intermediate frequency amplifier 39. It should be noted here that characteristics required of the intermediate frequency amplifier 39 in the FM mode in connection with intermodulation distortion are not as strict as in the CDMA mode, since the FM mode involves frequency modulation. That is, the conventional receiving circuit dissipates more power than is necessary while the FM mode is being selected. This tends to promote dissipation of cells and render the cellular telephone set less convenient than it should be.

SUMMARY OF THE INVENTION

It is therefore an object of the present invention to provide a receiving circuit of a cellular telephone set wherein an intermediate frequency amplifier in the FM mode operates from a reduced operating current, whereby premature dissipation of cells is forestalled and the cellular telephone set is made more convenient than before.

In carrying out the invention and according to one aspect thereof, there is provided a receiving circuit of a cellular telephone set, comprising an intermediate frequency amplifier including an amplifying transistor shared for use in both code division multiple access mode and frequency division multiple access mode; wherein a collector bias current of the transistor is switched to a large current in the code division multiple access mode and to a small current in the frequency division multiple access mode.

In a preferred structure according to the invention, the intermediate frequency amplifier is connected to a switching diode arrangement for deriving one of two types of intermediate frequency signals, one type of intermediate frequency signal coming from the intermediate frequency amplifier in the code division multiple access mode, the other type of intermediate frequency signal coming from the intermediate frequency amplifier in the frequency division multiple access mode; wherein the switching of the collector bias current of the transistor is interlocked to the switching of the switching diode arrangement.

In another preferred structure according to the invention, the switching diode arrangement comprises a first and a second switching diodes, the first switching diode deriving intermediate frequency signals of the code division multiple access mode when driven to conduct, the second switching diode deriving intermediate frequency signals of the frequency division multiple access mode when brought to conduct; wherein the conduction of one of the first and the second switching diodes is accomplished by application of a switching voltage, one of the first and the second switching diodes further acting as an intermediary to supply a base bias voltage to a base of the transistor and for switching the collector bias current.

In a further preferred structure according to the invention, the first and the second switching diodes are each connected to a feeding resistor feeding the switching voltage to cause the appropriate switching diode to conduct; wherein the feeding resistor connected to the first switching diode has a low resistance value and the feeding resistor connected to the second switching diode has a high resistance value, whereby the base bias voltage of the transistor is switched.

In an even further preferred structure according to the invention, the first and the second switching diodes are connected respectively to a first and a second intermediate frequency filters, the first switching diode acting as an intermediary to lead intermediate frequency signals of the code division multiple access mode from the intermediate frequency amplifier to the first intermediate frequency filter, the second switching diode serving as an intermediary to lead intermediate frequency signals of the frequency division multiple access mode from the intermediate frequency amplifier to the second intermediate frequency filter.

Other objects, features and advantages of the invention will become more apparent upon a reading of the following description and appended drawings.

DESCRIPTION OF THE PREFERRED EMBODIMENTS

Figure 1:
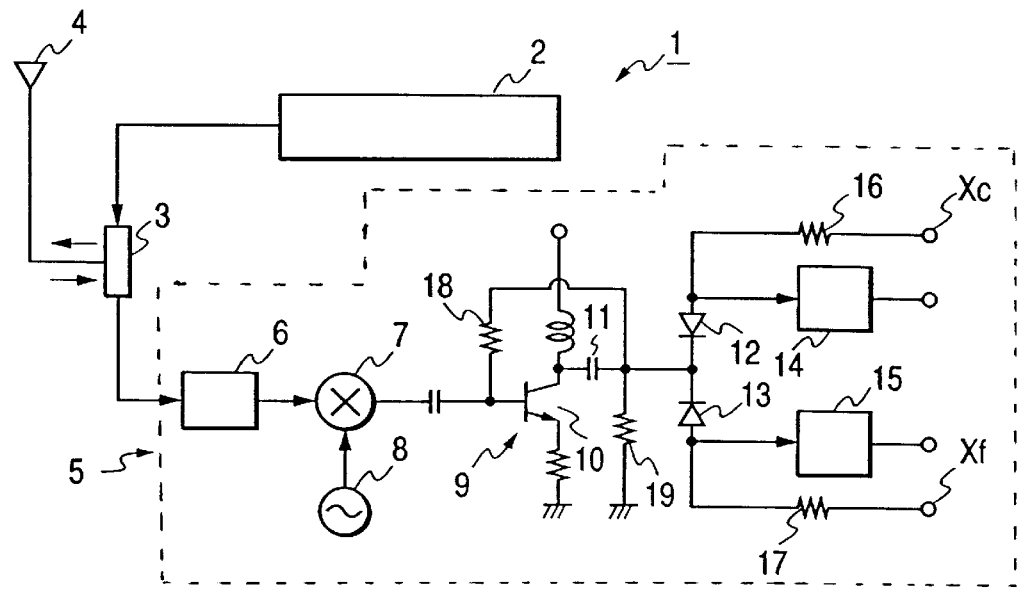
FIG. 1 is a circuit diagram of a receiving circuit of a cellular telephone set practiced as an embodiment of the present invention.
Figure 2:
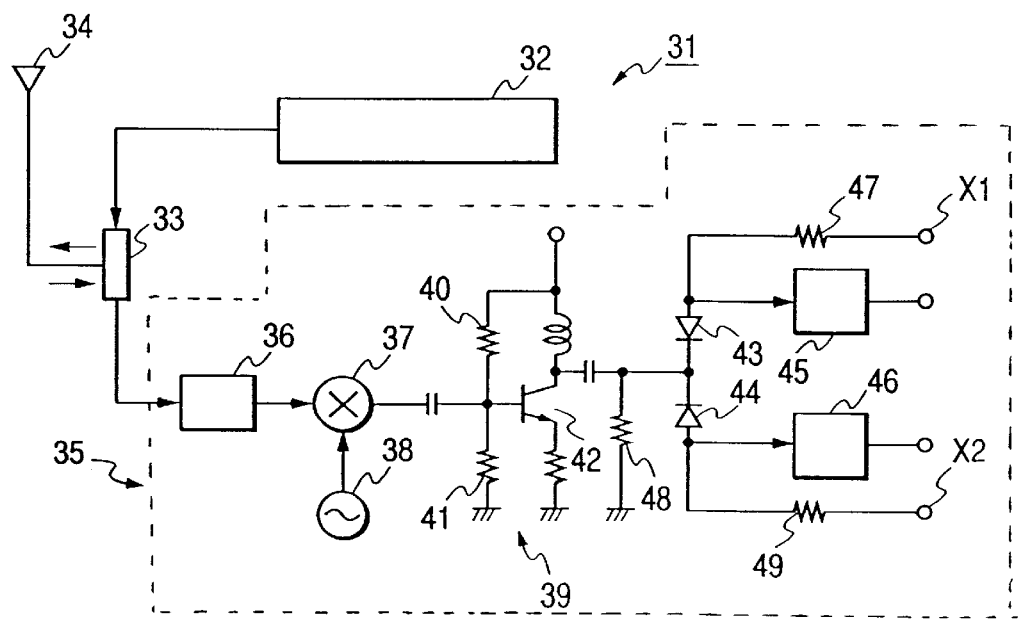
FIG. 2 is a circuit diagram of a conventional receiving circuit of a cellular telephone set.

A receiving circuit of a cellular telephone set practiced as a preferred embodiment of the invention will now be described with reference to FIG. 1. In a cellular telephone set 1, a signal from a transmitting circuit 2 is fed through an antenna sharing device 3 to an antenna 4 from which the signal is transmitted to a base station, not shown. A signal sent from the base station is received by the antenna 4 and input to a receiving circuit 5 via the antenna sharing device 3. This type of cellular telephone set 1 is capable of sending and receiving signals to and from the base station in either the code division multiple access mode (called the CDMA mode) or the frequency division multiple access mode (called the FM mode).

In the receiving circuit 5, a received signal on a bandwidth of about 880 MHz passes through the antenna sharing device 3 to reach a low-noise amplifier 6 for amplification. The amplified signal is input to a mixing circuit 7 whereby the signal is mixed with an oscillation signal from a local oscillator 8. The mixing circuit 7 outputs a signal with an intermediate frequency of about 85 MHz to an intermediate frequency amplifier 9. The intermediate frequency amplifier 9 is shared by the CDMA mode and FM mode. The amplifier 9 converts the frequency of the received signal to a bandwidth per channel of about 1.23 MHz for the CDMA mode or about 30 kHz for the FM mode. The received signal of either the CDMA or FM mode alone is converted in terms of frequency.

The intermediate frequency amplifier 9 uses a transistor 10 with its emitter connected to ground. The transistor 10 has its connector connected to one end of a DC arresting capacitor 11. The other end of the DC arresting capacitor 11 outputs an intermediate frequency signal amplified to the appropriate level. The other end of the DC arresting capacitor 11 is connected to the cathode of a first switching diode 12 and of a second switching diode 13. The first and second switching diodes 12 and 13 have their anodes connected respectively to a first intermediate frequency filter 14 and a second intermediate frequency filter 15. The first intermediate frequency filter 14 is a wide-band filter for filtering CDMA mode intermediate frequency signals, and the second intermediate frequency filter 15 is a narrow-band filter that filters FM mode intermediate frequency signals.

The first and second switching diodes 12 and 13 have their anodes also connected respectively to feeding resistors 16 and 17. It is through these feeding resistors 16 and 17 that mode switching voltages from mode switching terminals Xc and Xf are applied to the anodes of the first and second switching diodes 12 and 13 respectively. The feeding resistor 16 is lower in resistance value than the feeding resistor 17. A resistor 18 is connected interposingly between the cathode of the first and second switching diodes 12 and 13 on the one hand, and the base of the transistor 10 on the other hand. A resistor 19 is connected interposingly between the cathode of the first and second switching diodes 12 and 13 on the one hand, and ground on the other hand. The resistor 19 serves as a base bias transistor that determines a base bias voltage of the transistor 10.

When the cellular telephone set 1 is used in the CDMA mode, a mode switching voltage fed to the mode switching terminal Xc causes a current to flow through the resistor 16, first switching diode 12 and base bias resistor 19. The current brings the first switching diode 12 to conduct and causes the bias voltage, determined substantially by the feeding resistor 16 and base bias resistor 19, to reach the base of the transistor 10 via the resistor 18. This allows an intermediate frequency signal of the CDMA mode, amplified by the intermediate frequency amplifier 9, to arrive at the first intermediate frequency filter 14 (wide-band filter) through the first switching diode 12.

When the cellular telephone set 1 is used in the FM mode, a mode switching voltage applied to the mode switching terminal Xf causes a current to flow through the resistor 17, second switching diode 13 and base bias resistor 19. The current drives the second switching diode 13 to conduct and causes the bias voltage, determined substantially by the feeding resistor 17 and base bias resistor 19, to be supplied to the base of the transistor 10 through the resistor 18. This allows an intermediate frequency signal of the FM mode, amplified by the intermediate frequency amplifier 9, to reach the second intermediate frequency filter 15 (narrow-band filter) via the second switching diode 13.

The conduction of only the first switching diode 12 or the second switching diode 13 permits switching the collector bias current of the transistor 10. At the same time, this allows the first or second intermediate frequency filter to output the intermediate frequency signal of the applicable mode.

Because the feeding resistor 16 is lower than the feeding resistor 17 in resistance value, the transistor 10 has a higher base bias voltage and a larger collector bias current in the CDMA mode than in the FM mode. The feeding resistor 16 is selected to have a value such that the collector bias current of the transistor 10 will withstand the intermodulation distortion necessitated by the CDMA mode. The feeding resistor 17 is set to have a large resistance value such as to minimize the collector bias current of the transistor 10. In the FM mode, the distortion of the transistor 10 in the intermediate frequency amplifier 9 may increase but does not pose any problem because the FM mode involves frequency modulation. The resistance values of the feeding resistors 16 and 17 alone provide the basis for setting the collector bias current of the transistor 10.

As described, when one of the CDMA and FM modes is selected, the corresponding first or second switching diode 12 or 13 is brought on in an interlocking fashion to select the bias current of the appropriate mode for the intermediate frequency amplifier 9. That is, the transistor 10 of the intermediate frequency amplifier 9 is supplied with the optimum collector bias current for the mode in question. Particularly, a large bias current is furnished in the CDMA mode that requires minimizing intermodulation distortion; a small bias current is provided in the FM mode that is not so demanding with regard to intermodulation distortion, so that power dissipation of cells is minimized.

As described, the receiving circuit of a cellular telephone set according to the invention comprises an intermediate frequency amplifier including an amplifying transistor shared for use in both the code division multiple access mode and the frequency division multiple access mode. The collector bias current of the transistor is switched to a large current in the CDMA mode and to a small current in the FM mode. When the cellular telephone set is used in the CDMA mode, the distortion of the intermediate frequency amplifier is reduced; for use in the FM mode, the current dissipated by the intermediate frequency amplifier is minimized so as to economize the stored power of the cells. This makes the cellular telephone set handier and more helpful than before.

Preferably, the intermediate frequency amplifier is connected to a switching diode arrangement for deriving one of two types of intermediate frequency signals, one type of intermediate frequency signal coming from the intermediate frequency amplifier in the CDMA mode, the other type of intermediate frequency signal coming from the intermediate frequency amplifier in the FM mode. The switching of the collector bias current of the transistor is interlocked to the switching of the switching diode arrangement. With this structure, the collector bias current of the intermediate frequency amplifier is always switched to reflect the mode currently in effect.

Preferably, the switching diode arrangement comprises a first and a second switching diodes. The first switching diode derives intermediate frequency signals of the CDMA mode when driven to conduct, and the second switching diode derives intermediate frequency signals of the FM mode when brought to conduct. The conduction of one of the first and the second switching diodes is accomplished by application of a switching voltage. One of the first and the second switching diodes acts as an intermediary to supply a base bias voltage to a base of the transistor and for switching the collector bias current. This facilitates bias current switchover of the transistor in the intermediate frequency amplifier.

In addition, the first and the second switching diodes are each connected preferably to a feeding resistor feeding the switching voltage to cause the appropriate switching diode to conduct. The feeding resistor connected to the first switching diode has a low resistance value and the feeding resistor connected to the second switching diode has a high resistance value, whereby the base bias voltage of the transistor is switched. That is, the feeding resistors alone provide the basis for setting a switchable collector bias current of the transistor.

Furthermore, the first and the second switching diodes are preferably connected respectively to a first and a second intermediate frequency filters. The first switching diode acts as an intermediary to lead intermediate frequency signals of the CDMA mode from the intermediate frequency amplifier to the first intermediate frequency filter, and the second switching diode serves as an intermediary to lead intermediate frequency signals of the FM mode from the intermediate frequency amplifier to the second intermediate frequency filter. With this structure, simply switching the first and second switching diodes allows the intermediate frequency signal to be fed directly to the appropriate intermediate frequency filter.

As many apparently different embodiments of this invention may be made without departing from the spirit and scope thereof, it is to be understood that the invention is not limited to the specific embodiments thereof except as defined in the appended claims.

What is claimed is:

1. A receiving circuit of a cellular telephone set comprising:

intermediate frequency amplifier including a single amplifying transistor shared for use in both code division multiple access mode and frequency division multiple access mode;

a switching diode arrangement connected with the intermediate frequency amplifier and including a first switching diode and a second switching diode, the switching diode arrangement to derive one of two types of intermediate frequency signals, one type of intermediate frequency signal coming from said intermediate frequency amplifier in said code division multiple access mode and the other type of intermediate frequency signal coming from said intermediate frequency amplifier in said frequency division multiple access mode; and a resistor connected between a node of said first and said second switching diodes and a base of said transistor, the first switching diode to derive intermediate frequency signals of said code division multiple access mode when driven to conduct and the second switching diode to derive intermediate frequency signals of said frequency division multiple access mode when driven to conduct;

wherein a collector bias current of said transistor is switched to a first current in said code division multiple access mode and to a second current in said frequency division multiple access mode, the first current is larger than the second current;

the switching of said collector bias current of said transistor is interlocked to the switching of said switching diode arrangement, a switching voltage switches the conduction of one of said first and said second switching diodes, one of said first and said second switching diodes and said resistor further acts as an intermediary to supply a base bias voltage to the base of the transistor and to switch said collector bias current, the first switching diode is connected to a first feeding resistor and the second switching diode is connected to a second feeding resistor, the first and second feeding resistors feed the switching voltage to cause the appropriate switching diode to conduct, and the first feeding resistor is smaller than the second feeding resistor whereby the base bias voltage of the transistor is switched.

2. A receiving circuit of a cellular telephone set according to claim 1, wherein said first and said second switching diodes are connected respectively to a first and a second intermediate frequency filters, said first switching diode acting as an intermediary to lead intermediate frequency signals of said code division multiple access mode from said intermediate frequency amplifier to said first intermediate frequency filter, said second switching diode serving as an intermediary to lead intermediate frequency signals of said frequency division multiple access mode from said intermediate frequency amplifier to said second intermediate frequency filter.

* * * * *